(12) United States Patent
Nah et al.

(10) Patent No.: US 11,651,973 B2
(45) Date of Patent: May 16, 2023

(54) METHOD AND APPARATUS OF PROCESSOR WAFER BONDING FOR WAFER-SCALE INTEGRATED SUPERCOMPUTER

(71) Applicant: International Business Machines Corporation, Armonk, NY (US)

(72) Inventors: Jae-Woong Nah, Closter, NJ (US); Evan Colgan, Yorktown Heights, NY (US); Robert P. Kuder, II, Hopewell Junction, NY (US); James L. Speidell, Poughquag, NY (US); Bucknell C. Webb, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 497 days.

(21) Appl. No.: 16/869,744

(22) Filed: May 8, 2020

(65) Prior Publication Data
US 2021/0351043 A1      Nov. 11, 2021

(51) Int. Cl.
*H01L 21/48* (2006.01)
*H01L 21/67* (2006.01)
(Continued)

(52) U.S. Cl.
CPC ............ *H01L 21/4882* (2013.01); *G06F 1/20* (2013.01); *H01L 21/67092* (2013.01);
(Continued)

(58) Field of Classification Search
CPC ........... H01L 21/6875; H01L 21/67092; H01L 2224/03009; H01L 2224/80009;
(Continued)

(56) References Cited

U.S. PATENT DOCUMENTS

| | | |
|---|---|---|
| 6,992,383 B2 | 1/2006 | Mamitsu et al. |
| 7,812,416 B2 | 10/2010 | Courcimault |

(Continued)

FOREIGN PATENT DOCUMENTS

| | | |
|---|---|---|
| CN | 103187349 A | 7/2013 |
| CN | 207367928 U | 5/2018 |

(Continued)

OTHER PUBLICATIONS

Farren, S., "Wafer-Bonding Technologies and Strategies for 3D ICs", Wafer-Level 3D ICs Process Technology, 2008, pp. 49-83, Chapter 4.

(Continued)

*Primary Examiner* — Alia Sabur
(74) *Attorney, Agent, or Firm* — Scully, Scott, Murphy & Presser, P.C.; Daniel P. Morris

(57) ABSTRACT

A method and apparatus for bonding a processor wafer with a microchannel wafer/glass manifold to form a bonded wafer structure are provided. A glass fixture is also provided for protecting C4 solder bumps on chips disposed on the processor wafer. When the glass fixture is positioned on the processor wafer, posts extending from the glass fixture contact corresponding regions on the processor wafer devoid of C4 solder bumps, so that the glass fixture protects the C4 solder bumps during wafer bonding. The method involves positioning the processor wafer/glass fixture and the microchannel wafer/glass manifold in a metal fixture having one or more alignment structures adapted to engage corresponding alignment elements formed in the processor wafer, glass fixture and/or glass manifold. The metal fixture secures the wafer components in place and, after melting solder pellets disposed between the processor wafer/glass fixture and microchannel wafer/glass manifold, a bonded wafer structure is formed.

15 Claims, 8 Drawing Sheets

(51) Int. Cl.
- *H01L 23/473* (2006.01)
- *H01L 21/683* (2006.01)
- *H01L 23/367* (2006.01)
- *G06F 1/20* (2006.01)
- *H01L 23/00* (2006.01)
- *H01L 23/498* (2006.01)

(52) U.S. Cl.
CPC ........ *H01L 21/6835* (2013.01); *H01L 23/367* (2013.01); *H01L 23/473* (2013.01); *H01L 23/562* (2013.01); *G06F 2200/201* (2013.01); *H01L 23/49816* (2013.01); *H01L 2221/6834* (2013.01); *H01L 2224/11002* (2013.01); *H01L 2224/11009* (2013.01); *H01L 2224/94* (2013.01)

(58) Field of Classification Search
CPC ... H01L 2224/83005; H01L 2221/6834; H01L 2221/68313; H01L 2224/11001–11009; H01L 2224/94; H01L 21/68; H01L 2224/81815; H01L 24/743; B81C 1/00825; Y10T 29/49998; B25H 1/02; B25H 1/20

See application file for complete search history.

(56) References Cited

U.S. PATENT DOCUMENTS

| | | | |
|---|---|---|---|
| 8,926,775 | B2 | 1/2015 | Thallner |
| 9,568,960 | B2 | 2/2017 | Colgan et al. |
| 9,606,308 | B2 | 3/2017 | Barwicz et al. |
| 9,649,711 | B2 | 5/2017 | Azdasht |
| 9,704,822 | B2 | 7/2017 | Knickerbocker et al. |
| 10,249,516 | B2 | 4/2019 | Colgan et al. |

FOREIGN PATENT DOCUMENTS

| | | |
|---|---|---|
| DE | 19755088 A1 | 6/1999 |
| TW | M359788 U | 6/2009 |

OTHER PUBLICATIONS

Lee, S.H., et al., "Wafer-to-Wafer Alignment for Three-Dimensional Integration: A Review", Journal of Microelectromechanical Systems, Manuscript received Dec. 30, 2010, revised Mar. 11, 2011, accepted Mar. 26, 2011, Date of publication Jun. 9, 2011, date of current version Aug. 3, 2011., pp. 885-898, vol. 20, No. 4.

Plummer, J.D., "Silicon VLSI Technology: Fundamentals, Practice, and Modeling", Pearson, Jul. 24, 2000, 806 pages, 1 Edition.

Plummer, J.D., "Silicon VLSI Technology", Prentice Hall, Nov. 11, 2008, 2 Edition.

METHOD AND APPARATUS OF PROCESSOR WAFER BONDING FOR WAFER-SCALE INTEGRATED SUPERCOMPUTER

This invention was made with Government support under Contract No.: H98230-13-D0122/0005 awarded by Maryland Procurement Office. The Government has certain rights in this invention.

BACKGROUND

This disclosure generally relates to the assembly of semiconductor package components and, more specifically, to methods for aligning and bonding controlled collapse chip connection (C4) bumped whole size 300 millimeters (mm) wafers to a microchannel liquid circulating cooling component using a solder reflow process.

A supercomputer is made typically by connection of thousands of individually packaged processors. Each individually packaged processor is composed of a silicon (Si) chip, a laminate, and a heat sink. The Si chip is diced from a 300 mm Si wafer and is bonded with C4 micro solder bumps on a laminate. After attaching a heat sink on the backside of the Si chip, all the thousands of packaged processors are connected together through PCBs (printed circuit boards) and work together. Liquid cooling lines are connected to each heat sink to provide coolant to remove the heat generated from each Si chip.

U.S. Pat. No. 9,568,960 to Colgan et al., which is incorporated by reference herein in its entirety, claims a packaging structure that uses whole 300 mm processor wafers as one unit of a supercomputer instead of connecting thousands of individually packaged processors. This allows the whole 300 mm wafer to work as one big processor simultaneously. U.S. Pat. No. 9,568,960 describes a thick and heavy microchannel cooling unit to remove the heat generated from the whole 300 mm wafer. The microchannel cooler unit consists of a microchannel cooling wafer joined to five glass layers, where the outer diameter of the glass layers matches the outer diameter of the wafer. However, U.S. Pat. No. 9,568,960 does not disclose how to align and bond together a 300 mm processor wafer and a thick and heavy microchannel cooling unit without voids in the bonding layer. The processor wafer structures are typically formed by the sequential placement of layers at precise locations on the adjoining layer and C4 micro solder bumps are formed on the top layer of the wafer for bonding laminates to provide power and input/output signal connections. If the cooling unit is not properly aligned to the processor wafer and there are voids in the bonded layer between the processor wafer and the cooling unit, the cooling will not be adequate, and the supercomputer will not work properly. Moreover, if the C4 micro solder bumps on the processor wafer are damaged during bonding to the cooling unit, the subsequent laminate assembly will not function and the supercomputer will not work. Also, the bonding process for the thick and heavy microchannel cooling unit requires special fixtures.

SUMMARY

The present invention, as manifested in one or more embodiments thereof, provides a method and apparatus for accurately and efficiently aligning and bonding components of a whole size (e.g., 300 millimeter (mm)) processor wafer at high speeds, and a glass fixture used for assembling a wafer structure.

In accordance with an embodiment of the invention, a method for forming a bonded wafer structure includes: providing a processor wafer having a top surface and a bottom surface and comprising a plurality of chips disposed on the top surface and a first metal layer disposed on the bottom surface, wherein each at least a subset of the plurality of chips comprises a plurality of uniformly distributed C4 solder bumps having a first height and a plurality of regions devoid of any C4 solder bumps; providing a glass manifold assembly, the glass manifold assembly comprising a microchannel cooling wafer having a top surface, including a plurality of etched channels therein, and a bottom surface, including a second metal layer disposed thereon, wherein the top surface of the microchannel cooling wafer is contacted by a glass manifold; providing a glass fixture having top and bottom surfaces with a plurality of posts extending from the top surface to a second height, wherein the second height is greater than the first height, and wherein the plurality of posts is in registration with the plurality of regions devoid of any C4 solder bumps; positioning the glass fixture onto the top surface of the processor wafer, wherein the plurality of posts contacts the plurality of regions devoid of any C4 solder bumps, the glass fixture and the processor wafer together forming a wafer assembly; positioning the wafer assembly on a metal fixture having at least one alignment element, where the glass fixture contacts the metal fixture; applying a uniformly distributed plurality of solder pellets on the first metal layer; positioning the glass manifold assembly on the wafer assembly so that the second metal layer contacts the plurality of uniformly distributed solder pellets on the first metal layer; and melting the plurality of solder pellets to form a bonded solder layer, the first and second metal layers being attached by the bonded solder layer to thereby form the bonded wafer structure.

Optionally, in one embodiment of the method for forming the bonded wafer structure, each of the processor wafer and the microchannel cooling wafer has a first diameter, and the glass manifold has a second diameter, the first diameter being less than the second diameter. In another embodiment of the method for forming the bonded wafer structure, the plurality of C4 solder bumps has a diameter of at least 0.005 mm, and more preferably about 0.070 mm.

After bonding the first metal layer of the wafer assembly to the second metal layer of the glass manifold assembly, the solder pellets form a layer having a substantially uniform thickness of about 10 to 1,000 microns. In some embodiments, the bonding of the first and second metal layers is carried out sequentially in a formic acid environment and under a vacuum to reduce voids in the bonded solder layer. Preferably, the bonded solder layer has voids that are less than 9 mm.

Optionally, in the method for forming the bonded wafer structure, each of at least one of the first and second metal layers is formed as a multi-layer structure comprising layers of Au/Ni/Cu/Ti, Au/Ni/Ti, Au/Pd/Ti, Pd/Ni/Cu/Ti, or Pd/Ni/Ti. Preferably, each of the Au, Pd and Ti layers has a thickness of about 0.05 to 0.2 µm, the Ni layer has a thickness of about 0.1 to 1 µm, and the Cu layer has a thickness of about 0.5 to 2 µm.

In accordance with another embodiment of the invention, an apparatus for wafer bonding includes a metal fixture having a perimetrical edge and a central axis and being configured to receive one or more wafer components for forming a bonded wafer structure. The apparatus further includes multiple alignment structures, each of at least a first pair of the alignment structures being disposed at opposite sides of the metal fixture. Each alignment structure has a track extending along a common central axis. The apparatus includes multiple nose assemblies for securing the wafer components in the apparatus, each nose assembly being elastically biased to a corresponding one of the alignment structures and being configured to slideably engage the track in the corresponding one of the alignment structures for repositioning the nose assembly in the direction of the central axis. Each nose assembly includes a lower nose, extending from one end of a base portion of the nose assembly, and an upper nose extending from one end of a raised structure disposed on the base portion. The lower nose is adapted to engage a first alignment element formed in a first wafer component of the one or more wafer components, and the upper nose is adapted to engage a second alignment element formed in a second wafer component of the one or more wafer components. The lower and upper noses are adapted to align and secure the first and second wafer components in the metal fixture during the wafer bonding.

Techniques as disclosed herein can provide substantial beneficial technical effects. By way of example only and without limitation, one or more embodiments may provide one or more of the following advantages:

provides accurately aligned bonding between a whole 300 mm C4 bumped processor wafer and a thick and heavy microchannel cooling unit;

provides accurately aligned wafer bonding with a high thru-put;

maintains alignment while undergoing a temperature cycle from room temperature to about 270° C., without any "binding" which could result in unacceptable forces on the assembly during cool-down;

the fixture and wafer bonding process minimize non-uniform temperature gradients in the glass components, and thereby reduces the likelihood of fracture due to stress from non-uniform thermal expansion.

These and other features and advantages will become apparent from the following detailed description of illustrative embodiments thereof, which is to be read in connection with the accompanying drawings.

BRIEF DESCRIPTION OF THE DRAWINGS

Non-limiting and non-exhaustive embodiments of the present invention will be described with reference to the following drawings which are presented by way of example only, wherein like reference numerals (when used) indicate corresponding elements throughout the several views unless otherwise specified, and wherein.

Figure 1:
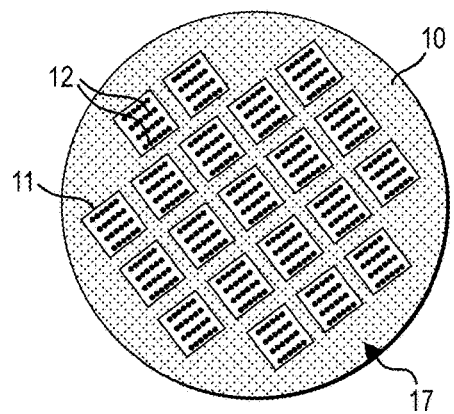
FIGS. 1 and 2 depict top plan and side views, respectively, of an exemplary processor wafer that includes a plurality of chips disposed on a top surface of the processor wafer.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present disclosure will be described herein in the context of illustrative methods and apparatus for accurately and efficiently aligning and bonding a processor wafer with C4 micro solder bumps to thick and heavy cooling components. It is to be appreciated, however, that the specific methods and apparatus illustratively shown and described herein are to be considered exemplary as opposed to limiting. Moreover, it will become apparent to those skilled in the art given the teachings herein that numerous modifications can be made to the embodiments shown that are within the scope of the appended claims. That is, no limitations with respect to the embodiments shown and described herein are intended or should be inferred.

Although the overall fabrication methods and the structures formed therewith according to the disclosed embodiments are entirely novel, certain individual processing steps required to form these structures may utilize conventional semiconductor fabrication techniques and conventional semiconductor fabrication tooling. These techniques and tooling will already be familiar to one having ordinary skill in the relevant art given the teachings herein. Moreover, many of the processing steps and tooling used to fabricate semiconductor devices are also described in a number of readily available publications, including, for example:

James D. Plummer et al., Silicon VLSI Technology, Prentice Hall; 2 edition (Nov. 11, 2008); and James D. Plummer et al., Silicon VLSI Technology: Fundamentals, Practice, and Modeling, Pearson; 1 edition (Jul. 24, 2000), both of which are hereby incorporated by reference herein in their entireties. It is emphasized that while some individual processing steps may be set forth herein, those steps are merely illustrative, and one skilled in the art may be familiar with several equally suitable alternatives that would also fall within the scope of the present disclosure.

It is to be appreciated that the various layers, regions and/or components shown in the accompanying figures are not necessarily drawn to scale. Furthermore, one or more semiconductor layers of a type commonly used in such integrated circuit structures may not be explicitly shown in a given figure for economy of description. This does not imply, however, that the semiconductor layer(s) not explicitly shown are omitted in the actual integrated circuit structure.

One objective of embodiments of the invention is to enable high-power operation of a processor wafer by providing a bonding layer with no voids larger than a prescribed diameter; for example, less than about 9 mm in diameter (for a power density of 26 W/cm$^2$, 20 degrees Celsius (° C.) inlet water temperature, and 50° C. maximum junction temperature (TJMAX)). The production of higher power density versions requires even smaller solder voids.

In order to achieve this required accuracy, the solder bonding layer needs to be contacted uniformly to the whole 300 mm wafer area, and the alignment between the processor wafer and the microchannel cooling wafer must be precise. Moreover, the C4 micro solder bumps on the chips side of the process wafer cannot be damaged during the wafer bonding process.

In typical semiconductor manufacturing, kerf regions at the edges of the chips in the dicing channels include alignment and yield management structures that are required structures. In wafer scale integration, these structures must be moved away from portions of the chips edges to allow the chip-to-chip electrical communication wires to be fabricated. Possible approaches are to place the kerf structures, for alignment and yield management, in the chip corners, or a center region of the chip. These provide C4-free regions where glass posts can contact the processor wafer.

As used herein, the term "C4" (controlled collapse chip connection), also known as "flip chip," refers to a well-known method for interconnecting semiconductor devices, such as IC chips and microelectromechanical systems (MEMS), to external circuitry with solder bumps that have been deposited onto the chip pads. Moreover, the solder bumps (C4s) on chip sites of the processor wafer must not be damaged during the wafer bonding process. The solder used to bond the processor wafer to the microchannel cooler assembly should have a higher melting point than the solder from which the C4s are formed so that when the C4s are used to subsequently attach laminates to the chip sites, the processor wafer remains attached to the microchannel cooler. This means that the C4s are liquid (i.e., molten) during the processor wafer-to-microchannel cooler assembly joining process and hence must be carefully protected from smearing, crushing, or being shorting together.

Coefficient of thermal expansion (CTE) mismatch between the semiconductor substrate and passive materials, such as, but not limited to, dielectrics and metals, is a major problem that causes wafer misalignment. In order to overcome the CTE mismatch, as well as minimize movement during the bonding process, nose assemblies that secure the wafer components in the metal fixture are spring-biased, in one or more embodiments. This allows the nose assemblies to maintain the positions of the wafer components when the wafers are bonded together.

In one embodiment of the present invention, two wafer assemblies are bonded together so that the components of the wafers are aligned with a high degree of accuracy. The first wafer assembly includes a processor wafer with a plurality of chips and C4 micro solder bumps on one surface and a metal layer on the opposing surface. The second wafer assembly has a microchannel cooling wafer attached to a thick and heavy glass manifold with a metal layer on the surface. In one or more embodiments, the metal layer on each wafer comprises one of the following structures: gold (Au)/nickel (Ni)/copper (Cu)/titanium (Ti), Au/Ni/Ti, Au/palladium (Pd)/Ti, Pd/Ni/Cu/Ti, or Pd/Ni/Ti. Preferred thicknesses of the individual layers is Au or Pd (0.05~0.2 µm), Ni (0.1~1 µm), Cu (0.5~2 µm), Ti (0.05~0.2 µm). The metal layers can be deposited on the wafers using any metal deposition means known to those of ordinary skill in the art. Preferred methods include, but are not limited to, evaporation and sputtering.

A preferred soldering method, according to one or more embodiments, uses solder reflow in formic acid (HCOOH) in combination with nitrogen, which provides a stable soldering process, reduces oxide film formation while no fluxing agent is required in the process. The formic acid vapors remove any oxide films, which inhibit wetting. A Model SRO-700 Table Top-IR Vacuum Reflow System, manufactured by ATV Technologie GmbH of Vaterstetten, Germany can be used to perform the soldering. The formic acid and nitrogen ambient is used when heating up the assembly to remove the oxide layer from the solder, and a vacuum ambient is used when the solder is melting and molten to minimize the formation of voids in the solder layer between the processor and microchannel wafers.

Figure 2:
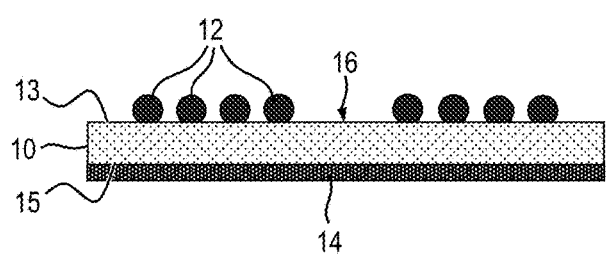

Aspects of the present invention, as manifested in one or more embodiments thereof, will now be described, with reference to the accompanying drawings. Specifically, FIGS. 1 and 2 depict top plan and side views, respectively, of an exemplary processor wafer 10 that includes a plurality of chips 11 disposed on a top surface 13 of the processor wafer, each of the chips being populated with a plurality of C4 micro solder bumps 12. At least one alignment element or structure, which in this embodiment comprises a positioning notch 17, is located on a perimeter of the wafer 10 to facilitate accurate alignment of the wafer to adjoining wafers in a subsequent process step. With reference to FIG. 2, the processor wafer 10 includes a metal layer 14 disposed on a bottom surface 15 of the processor wafer. One or more kerf regions 16 are shown on the top surface 13 of the processor wafer 10. A kerf region is defined as a region of the wafer that is free from C4 micro solder bumps 12.

Figure 3:
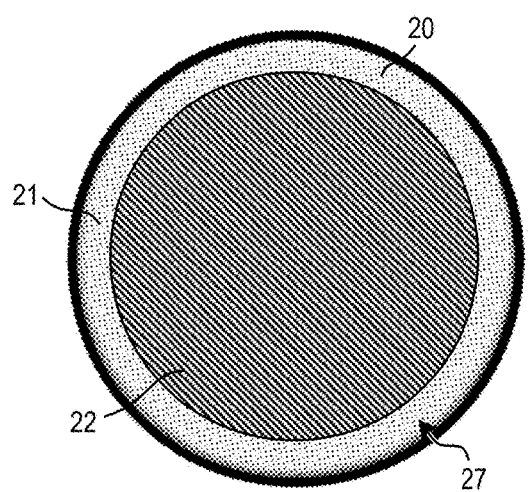
FIGS. 3 and 4 depict top plan and side views, respectively, of a microchannel cooling wafer attached on a top surface of a glass manifold, according to an embodiment of the invention.
Figure 4:
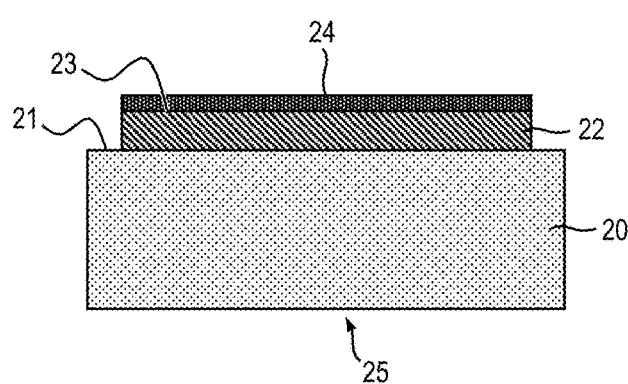

FIGS. 3 and 4 depict top plan and side views, respectively, of a microchannel cooling wafer 22 attached on a glass manifold 20, according to an embodiment of the invention. The microchannel cooling wafer 22, which is attached to a top surface 21 of the glass manifold 20, provides cooling and prevents the processor wafer 10 from damage due to overheating. In one or more embodiments, the microchannel cooling wafer 22 is fabricated from silicon, although embodiments of the invention are not limited to a silicon cooling wafer. The glass manifold 20, which is fabricated from a material which preferably has a thermal coefficient of expansion (TCE) equivalent to that of silicon (e.g., Borofloat 33), may contain multiple manifold layers that are joined into one integrated manifold with liquid cooling channels for delivering cooling fluid to microchannel cooling channels, and an exit. An alignment element or structure, which in this illustrative embodiment comprises a positioning notch 27, is located on the perimeter of the glass manifold 20 for accurate alignment with adjacent wafers. With reference to FIG. 4, a microchannel cooling wafer-glass manifold assembly 25 is formed by the microchannel cooling wafer 22 with a metal layer 24 on a top surface 23 of the microchannel cooling wafer 22.

Figure 5:
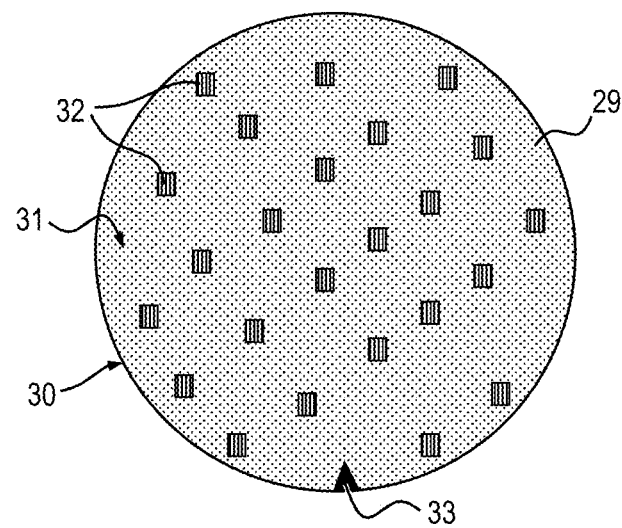
FIG. 5 is a top plan view showing a glass fixture with a plurality of posts extending vertically from a top surface thereof, according to an embodiment of the invention.
Figure 6:
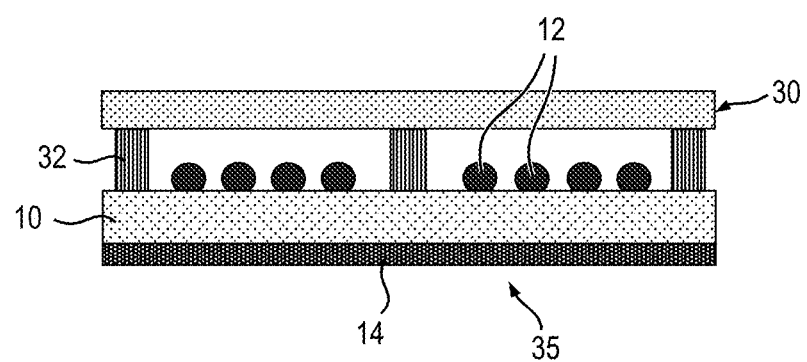
FIG. 6 is a side view depicting a processor wafer-glass fixture assembly including the exemplary processor wafer shown in FIG. 2 with posts extending from the illustrative glass fixture shown in FIG. 5 contacting the processor wafer in regions depopulated of C4 solder bumps, according to an embodiment of the invention.

It is important to note that, in accordance with embodiments of the invention, a diameter of the glass manifold 20 exceeds a diameter of the microchannel wafer 22, unlike the design shown in FIGS. 5 and 6 of U.S. Pat. No. 9,568,960. This feature is advantageous at least in part because for the glass manifold layer directly adjacent to the microchannel wafer, inlet/outlet manifold slots are required to provide coolant to each chip site, but these slots weaken the glass excessively, leading to unacceptably low manufacturing yields. One solution to this problem is to increase the diameter of the glass manifold layers so that there is an annulus of solid glass for added support, thereby strengthening the part and beneficially increasing manufacturing yield.

FIG. 5 is a top plan view showing a glass fixture 30 comprising a base or substrate 29 with a plurality of posts 32 extending vertically from a top surface 31 thereof, according to an embodiment of the invention. In one or more embodiments, the posts 32 are comprised of glass. It is to be appreciated that although embodiments of the invention are not limited to any specific dimensions of the posts, in one or more embodiments, each of the posts 32 has a height that is greater than the height of the C4 micro solder bumps disposed on the top surface 13 of the illustrative processor wafer 10 shown in FIG. 2. The location of the posts 32 is in registration with the plurality of C4 bump-free regions 16 on the processor wafer 10 shown in FIG. 2. An alignment element or structure, which in this illustrative embodiment comprises a positioning notch 33, is located on the perimeter of the glass fixture 30 for accurate alignment with adjacent wafers in a subsequent process step.

FIG. 6 is a side view depicting a processor wafer-glass fixture assembly 35, according to an embodiment of the invention. With reference to FIG. 6, the illustrative glass fixture 30 shown in FIG. 5 is flipped upside down, aligned and positioned on the top surface (13 in FIG. 2) of the exemplary processor wafer 10 to form the processor wafer-glass fixture assembly 35. The alignment notches 17 and 33 of the processor wafer 10 and the glass fixture 30, respectively, are aligned and their radius is preferably the same at the points where the alignment fixture will contact them. The C4 micro solder bumps are located between the processor wafer 10 and the glass fixture 30. The plurality of posts 32 contact the C4 bump-free top surface (16 in FIG. 2) of the processor wafer 10. The posts 32 align with the C4 bump-free regions of the processor wafer 10 where the C4s are depopulated, as previously described. Preferably, in one or more embodiments, the posts 32 have a substantially square cross-section and are at least 1 mm/side; more preferably, about 2 mm/side. It is to be appreciated, however, that embodiments of the invention are not limited to any specific shapes or dimensions of the posts 32.

Figure 7:
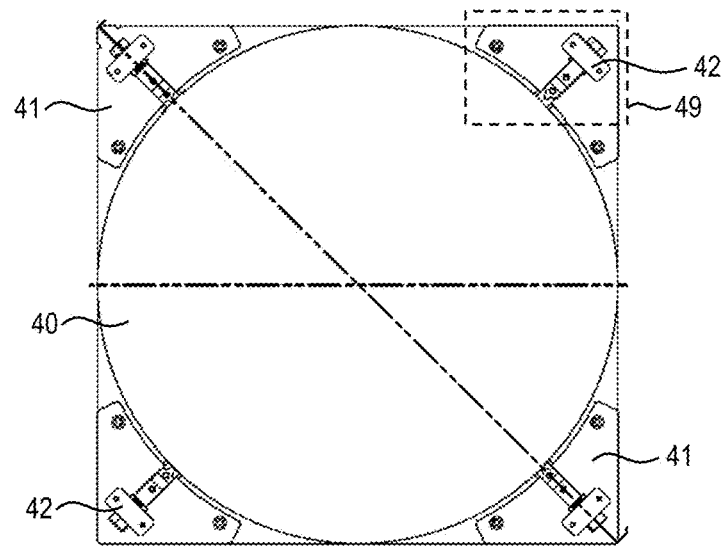
FIG. 7 is a top view of a metal fixture used for aligning the wafer components during assembly, according to embodiment of the invention.

FIG. 7 is a top view of a metal fixture 40 used for aligning the wafer components during assembly, according to an embodiment of the invention. In the embodiment shown in FIG. 7, the metal fixture 40 is square with an interior round region and there are four alignment structures 41 spaced equidistantly from each other and separated by approximately 90 degrees. The metal fixture 40 includes a plurality of nose assemblies 42 that are used to align the wafer components on the metal fixture 40. In one or more embodiments, four nose assemblies 42 are employed, equally spaced around the perimeter of the metal fixture 40 (e.g., in corners of the metal fixture), although the invention is not limited to the specific number of nose assemblies shown.

Figure 8:
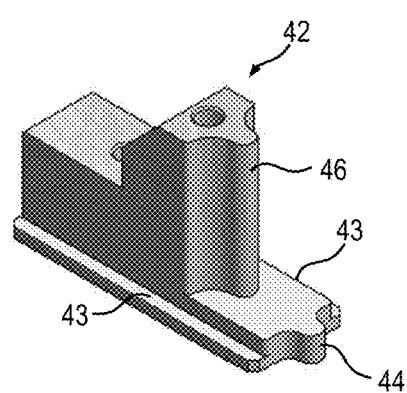
FIG. 8 is a perspective view of one of the nose assemblies shown in FIG. 7 with a lower and upper nose.
Figure 9:
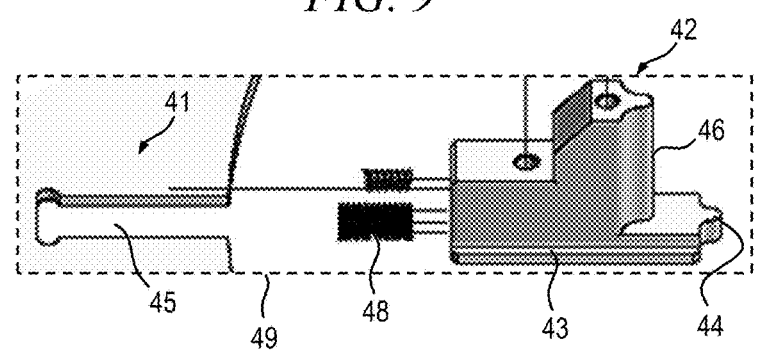
FIG. 9 is a side perspective view of the nose assembly shown in FIG. 8 with spring actuators for positioning the nose assembly, according to embodiment of the invention.

FIGS. 8 and 9 are perspective views depicting a close-up of the region 49 shown in FIG. 7. With reference to FIGS. 8 and 9, a nose assembly 42 includes a lower nose 44 extending from one end of a base portion of the nose assembly, and an upper nose 46 extending from one end of a raised structure disposed on the base portion. The lower nose 44 and upper nose 46 are adapted to assist in positioning the notches (e.g., 17, 27 and 33) and edges of the wafer/glass for alignment. One or more springs or other elastic fasteners 48 are attached, at a first end, to an end of the nose assembly 42 opposite the lower nose 44. A second end of the spring(s) 48 is attached to a corresponding alignment structure 41. During thermal cycling, the metal components of the fixture expand and contract more than the silicon wafers and glass components, so it is important to use springs or other compliant means to link them so that alignment is maintained at different temperatures. Sides of the nose assembly 42 have ridges or protrusions 43 formed therein that are adapted to be received in a track 45 formed in the alignment structure 41. More particularly, the ridges 43 of the nose assembly 42 are adapted to slideably engage the track 45 in the alignment structure 41. In this manner, the alignment structure 41 and corresponding spring(s) 48 enable the nose assembly 42 to be repositioned along a common central axis.

Figure 10:
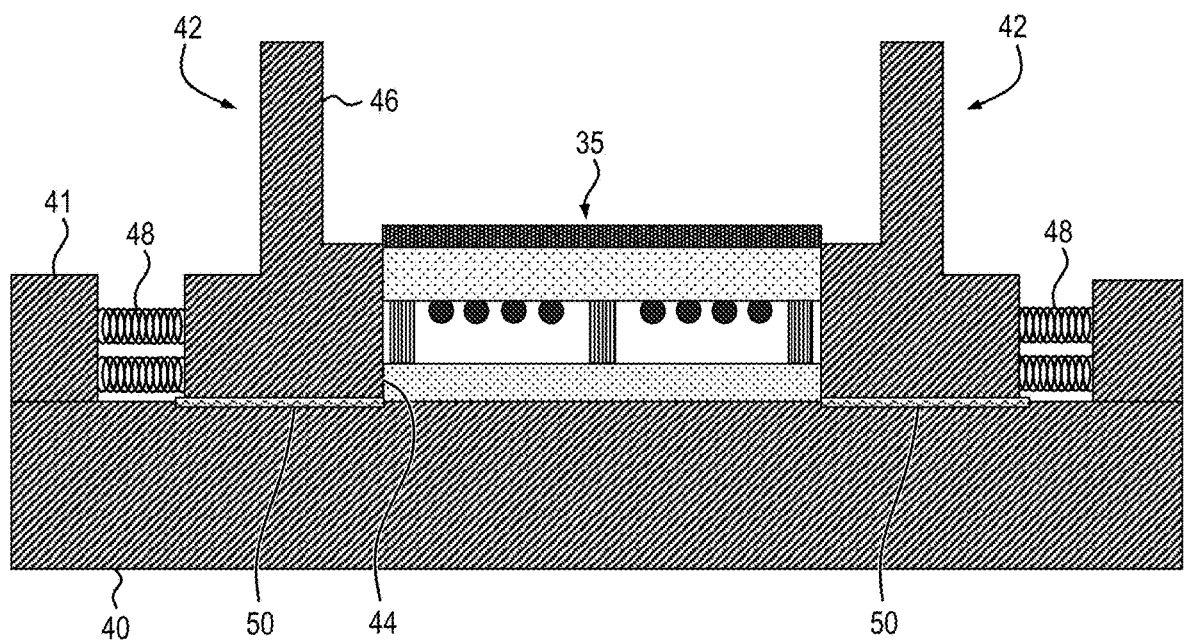
FIG. 10 is a side cut-away view of the metal fixture with two opposing nose assemblies securing the illustrative processor wafer-glass fixture assembly shown in FIG. 6, according to embodiment of the invention.

FIG. 10 is a side cut-away view of the metal fixture 40 with two opposing nose assemblies 42 securing a processor wafer-glass fixture assembly 35 (see FIG. 6) in place during the bonding process. The nose assemblies 42 are biased by the springs 48 so that the lower noses 44 maintain contact with the processor wafer-glass fixture assembly 35; alignment notches (e.g., 33 and 17) in both the glass fixture and face down processor wafer are engaged by the lower noses 44. At the points where the lower noses contact the processor wafer-glass fixture assembly 35, the radius of the glass fixture is equal to the radius of the processor wafer. A layer of lubricant 50 is positioned below the nose assemblies 42 (e.g., tracks 45 of the fixture 40) to facilitate movement of the nose assemblies 42 to compensate for the thermal expansion/contractions which occur during thermal cycling and to prevent binding.

Figure 11:
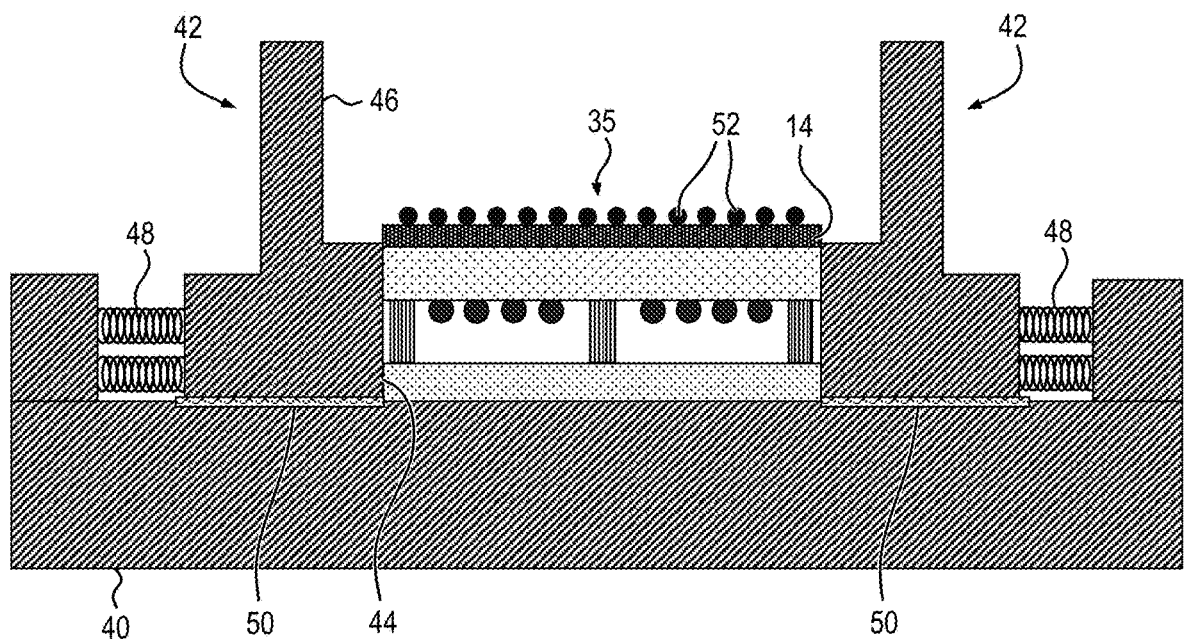
FIG. 11 is a side cut-away view of the metal fixture shown in FIG. 10 with multiple pellets of solder for wafer bonding deposited on the metal layer of the processor wafer-glass fixture assembly.

After the processor wafer-glass fixture assembly 35 is secured in the metal fixture 40, solder pellets 52 for wafer bonding are deposited on the metal layer 14 of the processor wafer 10 as shown in FIG. 11. It is necessary to uniformly distribute a number of solder pellets on the metal layer 14 so that when the solder starts melting, which greatly increases the thermal coupling between processor wafer (10 in FIG. 2) and microchannel cooler assembly (25 in FIG. 4), there is no large temperature gradient created in the microchannel wafer-glass manifold assembly which can result in fracture or cracks. This is especially important when the fixture and assembly are predominantly heated from the bottom.

Figure 12:
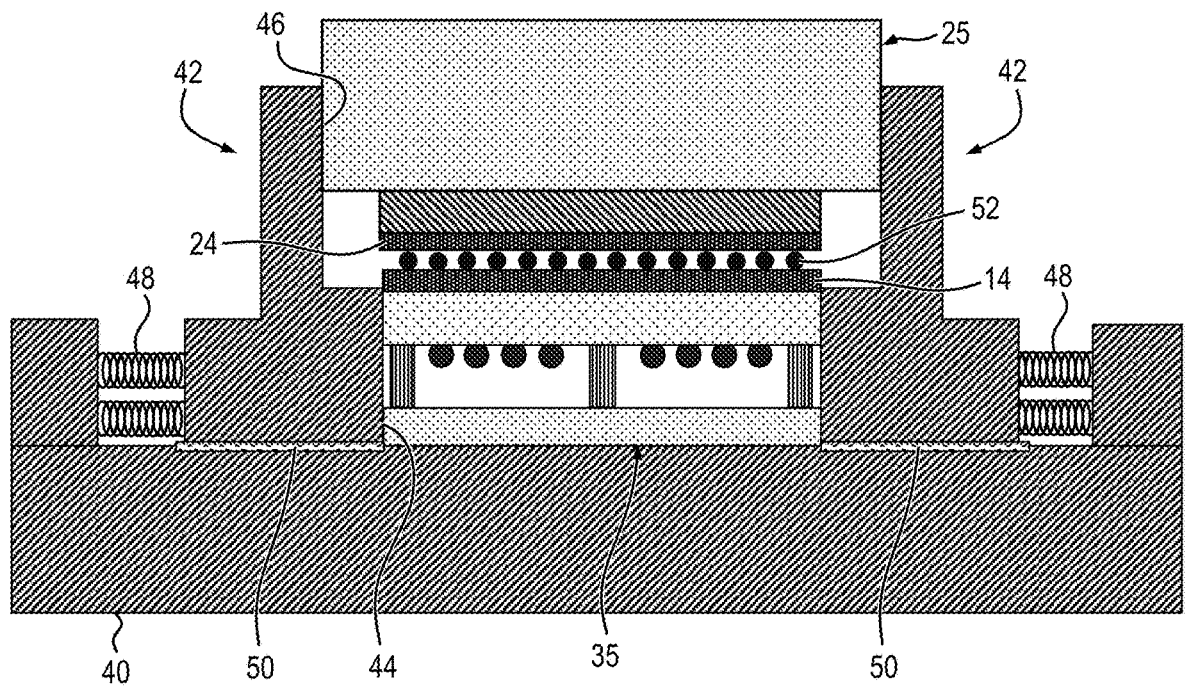
FIG. 12 is a side cut-away view of the metal fixture shown in FIG. 11 with the metal layer of the microchannel cooling wafer-glass manifold assembly shown in FIG. 4 contacting the multiple pellets of solder.

FIG. 12 shows a microchannel cooling wafer-glass manifold assembly 25 (see FIG. 4) positioned in the metal fixture 40 above the processor wafer-glass fixture assembly 35 and secured by the upper noses 46, one of which engages the alignment notch 27 in the microchannel cooling wafer-glass manifold assembly 25. The metal layer 24 of the microchannel cooling wafer-glass manifold assembly 25 contacts the solder pellets 52 to bond the microchannel cooling wafer-glass manifold assembly 25 to the metal layer 14 of the processor wafer-glass fixture assembly 35.

Figure 13:
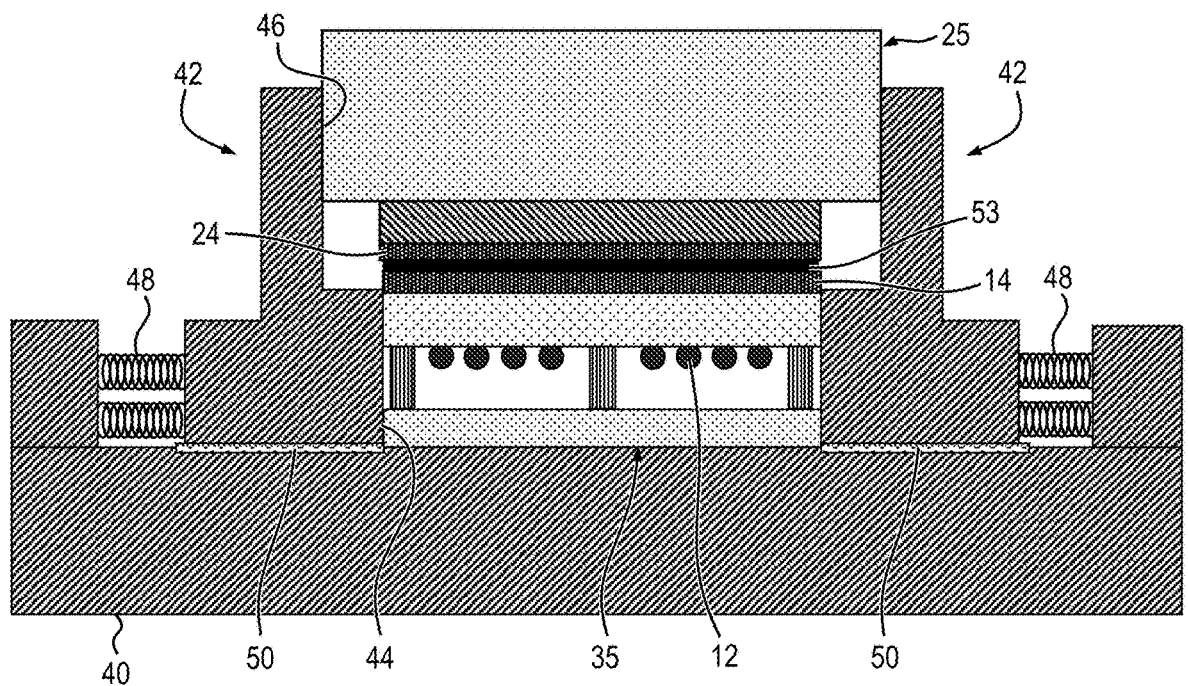
FIG. 13 is a side cut-away view of the metal fixture shown in FIG. 12 after reflow of the solder in formic acid and vacuum bonded the processor wafer and microchannel cooling wafer-glass manifold assembly together.

After heating, the solder pellets 52 will melt and flow together, preferably in a vacuum environment, to form a thin layer of solder 53, as shown in FIG. 13. With reference to FIG. 13, the melted solder layer 53 is spread between the metal layer 24 of the microchannel cooling wafer-glass manifold assembly 25 and the metal layer 14 of the processor wafer-glass fixture assembly 35. The weight of the microchannel cooling wafer-glass manifold assembly 25 distributes the solder 53 in a substantially uniform thickness.

Prior to melting, during the heating process, a formic acid and nitrogen ambient is used to remove any surface oxide layers from the solder, which improves the subsequent solder joining process. The nose assemblies 42 and springs 48 keep the wafer components aligned. The posts 32 of the glass fixture 30 protect the C4 micro solder bumps 12 from damage or adhering to another surface. The combined sequential use of formic acid and vacuum assist ensures that voids are not formed in the solder layer 53 as the bonded wafer structure (55 in FIG. 14) is formed.

After bonding of the processor wafer, the solder layer thickness is from 10 microns to 1,000 microns, and more preferably about 100 to 250 microns thick, in one or more embodiments. As the thickness of the solder layer 53 is increased, the overall flatness of the processor wafer after bonding is reduced, and as the thickness of the solder layer is reduced, the average size of voids in the solder layer increases, when they occur.

Figure 14:
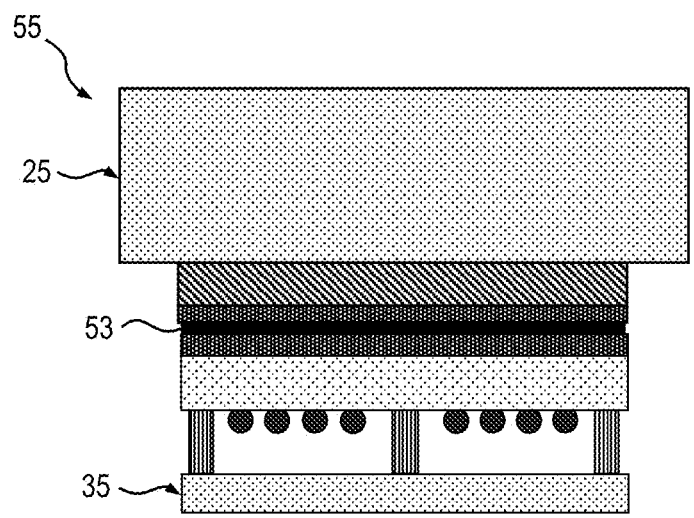
FIG. 14 is a side view of the glass fixture assembly with the processor wafer and microchannel cooling wafer-glass manifold assembly bonded together by a thin solder layer formed from the multiple pellets of solder after removal from a metal fixture, according to an embodiment of the invention.
Figure 15:
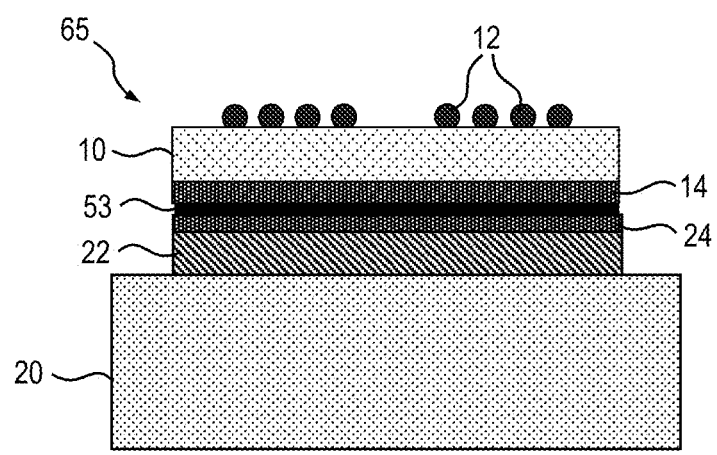
FIG. 15 is a side view of the processor wafer and microchannel cooling wafer-glass manifold assembly after it is flipped upside down and the glass fixture removed.

FIG. 14 is a side view depicting an exemplary wafer structure 55 after it is formed and removed from the metal fixture 40, according to an embodiment of the invention. The wafer structure 55 is then flipped upside down (i.e., the bottom surface becomes the top surface) and the glass fixture 30 is removed, as shown in FIG. 15. With reference now to FIG. 15, an illustrative completed wafer structure 65 according to one or more embodiments of the invention comprises, in ascending order starting at the base, a glass manifold 20, a microchannel cooling wafer 22, a first metal layer 24, a solder layer 53, a second metal layer 14, a processor wafer 10 and a plurality of C4 micro solder bumps 12.

Figure 16A:
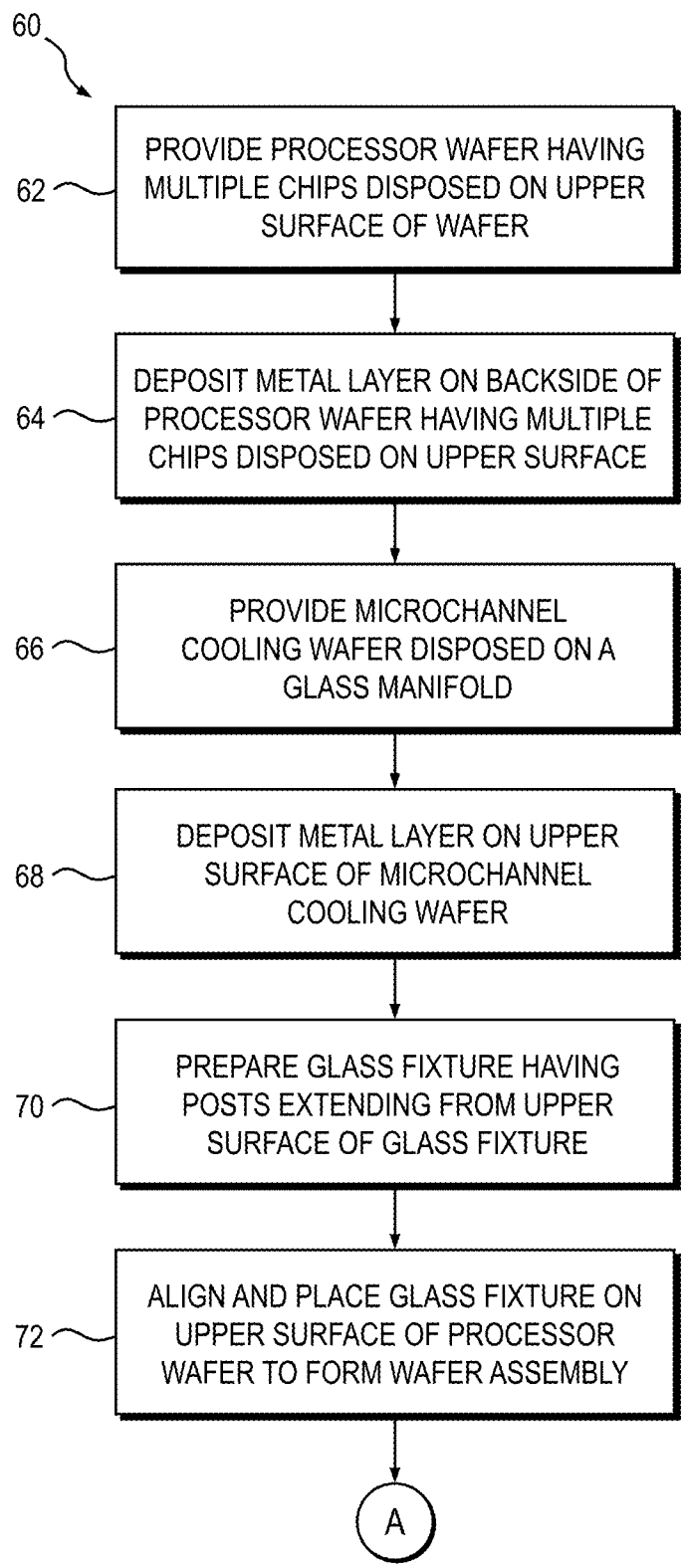
FIGS. 16A and 16B are flow diagrams depicting at least a portion of steps performed in an exemplary method for forming a bonded wafer structure, according to an embodiment of the invention.
Figure 16B:
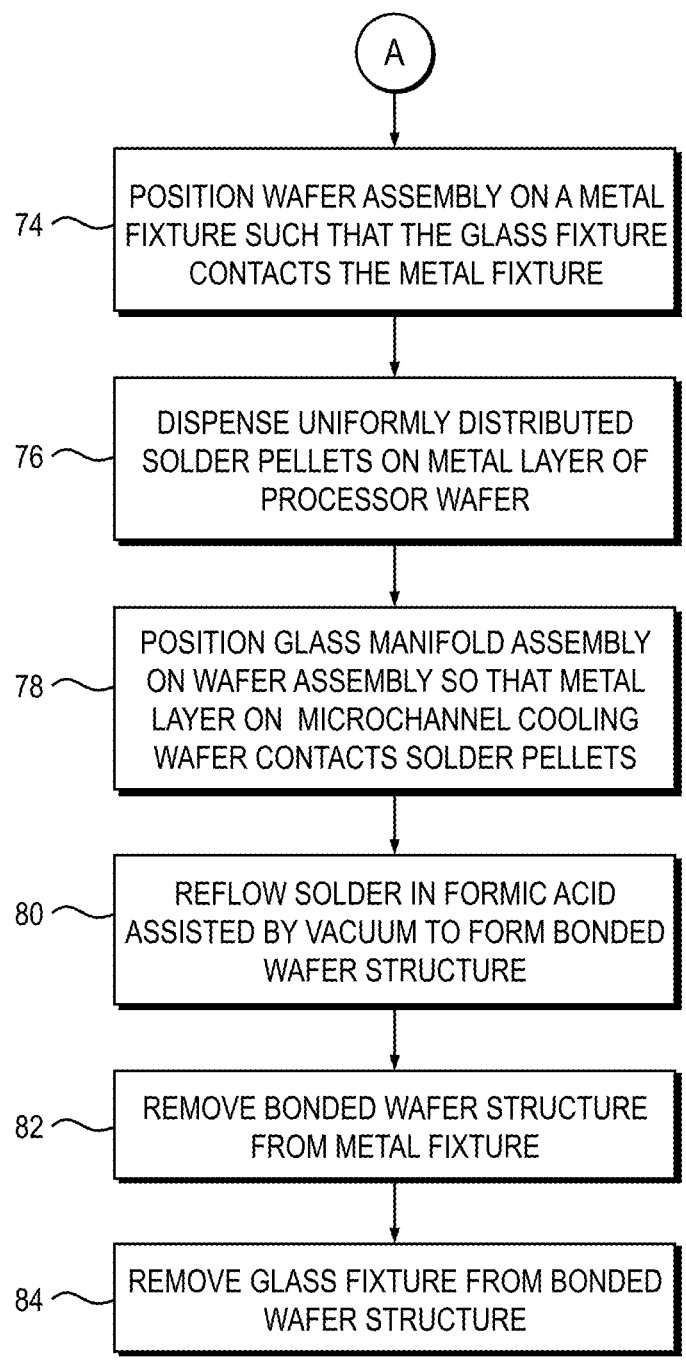

Given the discussion thus far, a beneficial method is provided for forming a bonded wafer structure. FIGS. 16A and 16B are flow diagrams depicting at least a portion of steps performed in an exemplary method 60 for forming a bonded wafer structure, according to an embodiment of the invention. Specifically, in step 62, a processor wafer (e.g., 10 in FIG. 2) is provided having multiple chips disposed on an upper surface of the wafer. Each of at least a subset of the chips preferably includes a plurality of C4 solder bumps formed thereon. A metal layer (e.g., 14 in FIG. 2) is deposited on a backside surface of the processor wafer in step 64, such as by evaporation or sputtering. The method further includes providing a microchannel cooling wafer (e.g., 22 in FIG. 4) disposed on a glass manifold (e.g., 20 in FIG. 4) in step 66. A metal layer (e.g., 24 in FIG. 4) is deposited on an upper surface of the microchannel cooling wafer in step 68, such as by evaporation or sputtering, to form a glass manifold assembly (e.g., 25 in FIG. 4).

With continued reference to FIGS. 16A and 16B, a glass fixture (e.g., 30 in FIGS. 5 and 6) is provided in step 70. The glass fixture has a plurality of posts (e.g., 32 in FIG. 6) extending vertically from an upper surface thereof. A height of the posts, which may be formed of glass or another material, is greater than a height of the C4 solder bumps formed on the chips of the processor wafer. In step 72, the glass fixture is aligned and placed on the upper surface of the processor wafer such that the posts contact areas of the processor wafer devoid of any C4 solder bumps and their respective notches, 17 and 33, are also aligned. The glass fixture, together with the processor wafer, form a wafer assembly (e.g., 35 in FIG. 6).

In step 74, the wafer assembly is positioned, upside down, between alignment structures (e.g., 42 in FIG. 10) of a metal fixture (e.g., 40 in FIG. 10), such that the glass fixture contacts the metal fixture. The metal fixture is adapted to receive the wafer assembly and the wafer assembly in place throughout the wafer bonding process. To assist in aligning the wafer assembly with the wafer to which it is to be bonded, the alignment structures preferably include alignment elements (e.g., nose assemblies 42 in FIG. 8) that engage with one or more corresponding alignment elements (e.g., notch 17 in FIG. 1 and notch 33 in FIG. 5) formed on the processor wafer and glass fixture, respectively.

Next, in step 76 solder pellets (e.g., 52 in FIG. 11) are dispensed on the metal layer of the processor wafer. Preferably, the solder pellets are uniformly distributed across the surface of the metal layer. The solder pellets may comprise preform, wires, foils and/or shots of high-temperature solder, such as solder alloy Pb70Sn30, although embodiments of the invention are not limited to this specific solder material or form. The glass manifold assembly is then positioned on the wafer assembly in step 78, such that the metal layer on the microchannel cooling wafer contacts the solder pellets. To assist in alignment of the microchannel cooling wafer with the processor wafer, the glass manifold preferably includes one or more alignment elements (e.g., notch 27 in FIG. 3) adapted to engage with the alignment structures of the metal fixture.

In step 80, the wafer and glass manifold assemblies are exposed to a heated environment to reflow the solder pellets. The weight of the glass manifold assembly on the solder pellets presses the melted solder to thereby form a uniform layer of solder which bonds the microchannel cooling wafer to the processor wafer to form the bonded wafer structure. In one or more embodiments, solder reflow is performed using formic acid assisted by a vacuum environment. The posts on the glass fixture prevent damage to the C4 solder bumps during the wafer bonding process.

In step 82, the bonded wafer structure is removed from the metal fixture. The glass fixture is then removed from the bonded wafer structure in step 84. At this point, the completed wafer structure is ready for a subsequent process (e.g., assembling substrates on the C4 solder bumps).

At least a portion of the circuits, structures and methods described above may be implemented in an integrated circuit. In forming integrated circuits, identical dies are typically fabricated in a repeated pattern on a surface of a semiconductor wafer. Each die includes a device or structure described herein, and may include other structures or components. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that may benefit from enhanced wafer bonding fabrication methods and structures formed in accordance with one or more of the exemplary embodiments.

The illustrations of embodiments described herein are intended to provide a general understanding of the various embodiments, and they are not intended to serve as a complete description of all the elements and/or features of apparatus, methods and systems that might make use of the circuits, structures and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of exemplary methods described herein may occur out of the order described or noted in the figures (where shown). For example, two steps described or shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Reference made throughout this specification to "one embodiment" or "an embodiment" is intended to mean that a particular feature, structure, step, or characteristic described in connection with the embodiment is included in at least one embodiment of the claimed subject matter. It is to be understood that appearances of the phrase "in one embodiment" or "an embodiment" are not necessarily all referring to the same embodiment. Furthermore, embodiments may be referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it is to be appreciated that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Relational terms such as "above," "below," "top," or "bottom," where used, are intended to indicate the location or movement of elements or structures relative to one another as opposed to absolute position.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof.

The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A method for forming a bonded wafer structure, the method comprising:
   providing a processor wafer having a top surface and a bottom surface and comprising a plurality of chips disposed on the top surface and a first metal layer disposed on the bottom surface, wherein each at least a subset of the plurality of chips comprises a plurality of uniformly distributed C4 solder bumps having a first height and a plurality of regions devoid of any C4 solder bumps;
   providing a glass manifold assembly, the glass manifold assembly comprising a microchannel cooling wafer having a top surface, including a plurality of etched channels therein, and a bottom surface, including a second metal layer disposed thereon, wherein the top surface of the microchannel cooling wafer is contacted by a glass manifold;
   providing a glass fixture having top and bottom surfaces with a plurality of posts extending from the top surface to a second height, wherein the second height is greater than the first height, and wherein the plurality of posts is in registration with the plurality of regions devoid of any C4 solder bumps;
   positioning the glass fixture onto the top surface of the processor wafer, wherein the plurality of posts contacts the plurality of regions devoid of any C4 solder bumps, the glass fixture and the processor wafer together forming a wafer assembly;
   positioning the wafer assembly on a metal fixture having at least one alignment element, where the glass fixture contacts the metal fixture;
   applying a uniformly distributed plurality of solder pellets on the first metal layer;

positioning the glass manifold assembly on the wafer assembly so that the second metal layer contacts the plurality of uniformly distributed solder pellets on the first metal layer;

melting the plurality of solder pellets to form a bonded solder layer, the first and second metal layers being attached by the bonded solder layer to thereby form the bonded wafer structure.

2. The method according to claim 1, wherein at least a subset of the plurality of chips disposed on the top surface of the processor wafer are connected together using wiring layers formed in the processor wafer.

3. The method according to claim 1, wherein each of the processor wafer and the microchannel cooling wafer has a first diameter, and the glass manifold has a second diameter, and wherein the first diameter is less than the second diameter.

4. The method according to claim 1, further comprising:
removing the bonded wafer structure from the metal fixture; and
removing the glass fixture from the bonded wafer structure.

5. The method according to claim 1, wherein each of the plurality of C4 solder bumps has a diameter of at least 0.005 millimeter.

6. The method according to claim 1, wherein each of the plurality of C4 solder bumps has a diameter of about 0.070 millimeter.

7. The method according to claim 1, wherein after melting, the plurality of solder pellets forms a layer having a substantially uniform thickness from about 10 to 1,000 microns.

8. The method according to claim 7, wherein the layer formed by the solder pellets has a uniform thickness from about 100 to 250 microns.

9. The method according to claim 1, wherein at least one of the first and second metal layers comprises a multi-layer structure.

10. The method according to claim 9, wherein the multi-layer structure comprises one of layers of gold (Au)/nickel (Ni)/copper (Cu)/titanium (Ti), Au/Ni/Ti, Au/palladium (Pd)/Ti, Au/Pd/Ni/Ti, Pd/Ni/Cu/Ti, and Pd/Ni/Ti.

11. The method according to claim 10, wherein in the multi-layer structure, the layers of Au, Pd and Ti each have a thickness from about 0.03 to 0.2 μm, the layer of Ni has a thickness from about 0.1 to 1 μm, and the layer of Cu has a thickness from about 0.2 to 2 μm.

12. The method according to claim 1, wherein melting the plurality of solder pellets comprises:
using a formic acid and nitrogen environment during heating, before the solder pellets melt, to remove surface oxide layers from the solder pellets; and
applying a vacuum as the solder pellets are melting to thereby reduce voids in the bonded solder layer.

13. The method according to claim 1, wherein after melting, the plurality of solder pellets forms a substantially uniform layer having voids less than 9 millimeters.

14. The method according to claim 1, wherein at least one of the processor wafer and the glass fixture comprises at least one alignment element formed in a periphery of the respective processor wafer and glass fixture, and wherein positioning the wafer assembly on the metal fixture comprises aligning the alignment elements of the processor wafer and the glass fixture with the alignment element of the metal fixture.

15. The method according to claim 1, wherein the glass manifold assembly comprises at least one alignment element formed in a periphery of the glass manifold, and wherein positioning the glass manifold assembly on the wafer assembly comprises aligning the alignment elements of the glass manifold and the metal fixture.

* * * * *